(12) United States Patent
Watts et al.

(10) Patent No.: US 7,071,088 B2
(45) Date of Patent: Jul. 4, 2006

(54) METHOD FOR FABRICATING BULBOUS-SHAPED VIAS

(75) Inventors: Michael P. C. Watts, Austin, TX (US); Sidlgata V. Sreenivasan, Austin, TX (US)

(73) Assignee: Molecular Imprints, Inc., Austin, TX (US)

( * ) Notice: Subject to any disclaimer, the term of this patent is extended or adjusted under 35 U.S.C. 154(b) by 416 days.

(21) Appl. No.: 10/227,105

(22) Filed: Aug. 23, 2002

(65) Prior Publication Data

US 2004/0038552 A1 Feb. 26, 2004

(51) Int. Cl.
*H01L 21/44* (2006.01)

(52) U.S. Cl. ...................... 438/612; 438/666

(58) Field of Classification Search ............... 438/597, 438/612, 613, 665, 666, 668, 669, 672, 674, 438/675; 264/31, 32
See application file for complete search history.

(56) References Cited

U.S. PATENT DOCUMENTS

| | | |
|---|---|---|
| 3,783,520 A | 1/1974 | King |
| 3,807,027 A | 4/1974 | Heisler |
| 3,807,029 A | 4/1974 | Troeger |
| 3,811,665 A | 5/1974 | Seelig |
| 4,062,600 A | 12/1977 | Wyse |
| 4,070,116 A | 1/1978 | Frosch et al. |
| 4,098,001 A | 7/1978 | Watson |
| 4,119,688 A | 10/1978 | Hiraoka |

(Continued)

FOREIGN PATENT DOCUMENTS

| DE | 2800476 | 7/1978 |
|---|---|---|
| DE | 19648844 | 9/1997 |
| EP | 244884 | 3/1987 |
| EP | 733455 | 9/1996 |
| JP | 55-88332 | 12/1978 |
| JP | 57-7931 | 6/1980 |
| JP | 63-138730 | 10/1986 |
| JP | 1-196749 | 8/1989 |

(Continued)

OTHER PUBLICATIONS

U.S. Appl. No. 09/698,317, filed Oct. 27, 2000, Chol et al.
U.S. Appl. No. 09/905,718, filed May 16, 2002, Willson et al.
U.S. Appl. No. 09/907,512, filed Jul. 16, 2001, Sreenivasan et al.
U.S. Appl. No. 09/908,455, filed Jul. 17, 2001, Choi et al.
U.S. Appl. No. 09/908,765, filed Jul. 19, 2001, Willson et al.
U.S. Appl. No. 09/920,341, filed Aug. 1, 2001, Choi et al.
U.S. Appl. No. 09/934,248, filed Aug. 21, 2001, Choi et al.
U.S. Appl. No. 09/976,681, filed Oct. 12, 2001, Bailey et al.

(Continued)

*Primary Examiner*—Michael S. Lebentritt
*Assistant Examiner*—Scott B. Geyer
(74) *Attorney, Agent, or Firm*—Kenneth C. Brooks

(57) ABSTRACT

The present invention provides a method for fabricating bulbous-shaped vias on a substrate, having a surface, by disposing, on the substrate, a polymerizable fluid composition. A mold is placed in contact with the polymerizable fluid composition. The mold includes a relief structure on a surface thereof to create a recess in a layer of the polymerizable fluid composition. The polymerizable fluid composition is subjected to conditions to cause polymerization, forming a polymerized layer having a solidified indentation. An opening to the surface of the substrate is formed by removing material disposed on the substrate surface through etch processes. In a further embodiment a conductive layer may be disposed in the opening to form a gate. A lift-off process may be employed to remove the polymerized layer.

28 Claims, 6 Drawing Sheets

U.S. PATENT DOCUMENTS

| | | |
|---|---|---|
| 4,155,169 A | 5/1979 | Drake et al. |
| 4,201,800 A | 5/1980 | Alcorn et al. |
| 4,202,107 A | 5/1980 | Watson |
| 4,267,212 A | 5/1981 | Sakawaki |
| 4,337,579 A | 7/1982 | De Fazio |
| 4,355,469 A | 10/1982 | Nevins et al. |
| 4,414,750 A | 11/1983 | De Fazio |
| 4,426,247 A | 1/1984 | Tamamura et al. |
| 4,440,804 A | 4/1984 | Milgram |
| 4,451,507 A | 5/1984 | Beltz et al. |
| 4,507,331 A | 3/1985 | Hiraoka |
| 4,544,572 A | 10/1985 | Sandvig et al. |
| 4,552,833 A | 11/1985 | Ito et al. |
| 4,600,309 A | 7/1986 | Fay |
| 4,610,442 A | 9/1986 | Oku et al. |
| 4,657,845 A | 4/1987 | Frechet et al. |
| 4,692,205 A | 9/1987 | Sachdev et al. |
| 4,694,703 A | 9/1987 | Routson |
| 4,707,218 A | 11/1987 | Giammarco et al. |
| 4,731,155 A | 3/1988 | Napoli et al. |
| 4,737,425 A | 4/1988 | Lin et al. |
| 4,763,886 A | 8/1988 | Takei |
| 4,808,511 A | 2/1989 | Holmes |
| 4,826,943 A | 5/1989 | Ito et al. |
| 4,848,911 A | 7/1989 | Uchida et al. |
| 4,857,477 A | 8/1989 | Kanamori |
| 4,891,303 A | 1/1990 | Garza et al. |
| 4,908,298 A | 3/1990 | Hefferon et al. |
| 4,919,748 A | 4/1990 | Bredbenner et al. |
| 4,921,778 A | 5/1990 | Thackeray et al. |
| 4,929,083 A | 5/1990 | Brunner |
| 4,931,351 A | 6/1990 | McColgin et al. |
| 4,959,252 A | 9/1990 | Bonnebat et al. |
| 4,964,945 A | 10/1990 | Calhoun |
| 4,976,818 A | 12/1990 | Hashimoto et al. |
| 4,980,316 A | 12/1990 | Huebner |
| 4,999,280 A | 3/1991 | Hiraoka |
| 5,053,318 A | 10/1991 | Gulla et al. |
| 5,071,694 A | 12/1991 | Uekita et al. |
| 5,072,126 A | 12/1991 | Progler |
| 5,074,667 A | 12/1991 | Miyatake |
| 5,108,875 A | 4/1992 | Thackeray et al. |
| 5,110,514 A | 5/1992 | Soane |
| 5,126,006 A | 6/1992 | Cronin et al. |
| 5,148,036 A | 9/1992 | Matsugu et al. |
| 5,148,037 A | 9/1992 | Suda et al. |
| 5,151,754 A | 9/1992 | Ishibashi et al. |
| 5,169,494 A | 12/1992 | Hashimoto et al. |
| 5,173,393 A | 12/1992 | Sezi et al. |
| 5,179,863 A | 1/1993 | Uchida et al. |
| 5,198,326 A | 3/1993 | Hashimoto et al. |
| 5,204,739 A | 4/1993 | Domenicali |
| 5,212,147 A | 5/1993 | Sheats |
| 5,234,793 A | 8/1993 | Sebald et al. |
| 5,240,550 A | 8/1993 | Boehnke et al. |
| 5,240,878 A | 8/1993 | Fitzsimmons et al. |
| 5,242,711 A | 9/1993 | DeNatale et al. |
| 5,244,818 A | 9/1993 | Jokerst et al. |
| 5,246,880 A * | 9/1993 | Reele et al. .................. 437/183 |
| 5,259,926 A | 11/1993 | Kuwabara et al. |
| 5,314,772 A | 5/1994 | Kozicki et al. |
| 5,318,870 A | 6/1994 | Hartney |
| 5,324,683 A | 6/1994 | Fitch et al. |
| 5,328,810 A | 7/1994 | Lowrey et al. |
| 5,330,881 A | 7/1994 | Sidman et al. |
| 5,348,616 A | 9/1994 | Hartman et al. |
| 5,362,606 A | 11/1994 | Hartney et al. |
| 5,366,851 A | 11/1994 | Novembre |
| 5,374,454 A | 12/1994 | Bickford et al. |
| 5,376,810 A | 12/1994 | Hoenk et al. |
| 5,380,474 A | 1/1995 | Rye et al. |
| 5,392,123 A | 2/1995 | Marcus et al. |
| 5,417,802 A | 5/1995 | Obeng |
| 5,421,981 A | 6/1995 | Leader et al. |
| 5,422,295 A | 6/1995 | Choi et al. |
| 5,424,549 A | 6/1995 | Feldman |
| 5,425,848 A | 6/1995 | Haisma et al. |
| 5,425,964 A | 6/1995 | Southwell et al. |
| 5,431,777 A | 7/1995 | Austin et al. |
| 5,439,766 A | 8/1995 | Day et al. |
| 5,452,090 A | 9/1995 | Progler et al. |
| 5,453,157 A | 9/1995 | Jeng |
| 5,458,520 A | 10/1995 | DeMercurio et al. |
| 5,468,542 A | 11/1995 | Crouch |
| 5,480,047 A | 1/1996 | Tanigawa et al. |
| 5,512,131 A | 4/1996 | Kumar et al. |
| 5,515,167 A | 5/1996 | Ledger et al. |
| 5,527,662 A | 6/1996 | Hashimoto et al. |
| 5,545,367 A | 8/1996 | Bae et al. |
| 5,566,584 A | 10/1996 | Briganti |
| 5,633,505 A | 5/1997 | Chung et al. |
| 5,654,238 A | 8/1997 | Cronin et al. |
| 5,669,303 A | 9/1997 | Maracas et al. |
| 5,670,415 A | 9/1997 | Rust |
| 5,700,626 A | 12/1997 | Lee et al. |
| 5,723,176 A | 3/1998 | Keyworth et al. |
| 5,724,145 A | 3/1998 | Kondo et al. |
| 5,725,788 A | 3/1998 | Maracas et al. |
| 5,736,424 A | 4/1998 | Prybyla et al. |
| 5,743,998 A | 4/1998 | Park |
| 5,747,102 A | 5/1998 | Smith et al. |
| 5,753,014 A | 5/1998 | Van Rijn |
| 5,760,500 A | 6/1998 | Kondo et al. |
| 5,772,905 A | 6/1998 | Chou |
| 5,776,748 A | 7/1998 | Singhvi et al. |
| 5,779,799 A | 7/1998 | Davis |
| 5,802,914 A | 9/1998 | Fassler et al. |
| 5,804,474 A | 9/1998 | Sakaki et al. |
| 5,855,686 A | 1/1999 | Rust |
| 5,877,036 A | 3/1999 | Kawai |
| 5,877,861 A | 3/1999 | Ausschnitt et al. |
| 5,884,292 A | 3/1999 | Baker et al. |
| 5,888,650 A | 3/1999 | Calhoun et al. |
| 5,895,263 A | 4/1999 | Carter et al. |
| 5,900,160 A | 5/1999 | Whitesides et al. |
| 5,907,782 A | 5/1999 | Wu |
| 5,912,049 A | 6/1999 | Shirley |
| 5,926,690 A | 7/1999 | Toprac et al. |
| 5,942,871 A | 8/1999 | Lee |
| 5,948,219 A | 9/1999 | Rohner |
| 5,948,470 A | 9/1999 | Harrison et al. |
| 5,948,570 A | 9/1999 | Kornblit et al. |
| 5,952,127 A | 9/1999 | Yamanaka |
| 6,033,977 A | 3/2000 | Gutsche et al. |
| 6,035,805 A | 3/2000 | Rust |
| 6,038,280 A | 3/2000 | Rossiger et al. |
| 6,039,897 A | 3/2000 | Lochhead et al. |
| 6,046,056 A | 4/2000 | Parce et al. |
| 6,051,345 A | 4/2000 | Huang |
| 6,074,827 A | 6/2000 | Nelson et al. |
| 6,091,485 A | 7/2000 | Li et al. |
| 6,096,655 A | 8/2000 | Lee et al. |
| 6,125,183 A | 9/2000 | Jiawook et al. |
| 6,128,085 A | 10/2000 | Buermann et al. |
| 6,143,412 A | 11/2000 | Schueller et al. |
| 6,150,231 A | 11/2000 | Muller et al. |
| 6,150,680 A | 11/2000 | Eastman et al. |
| 6,168,845 B1 | 1/2001 | Fontana, Jr. et al. |
| 6,180,239 B1 | 1/2001 | Whitesides et al. |
| 6,204,922 B1 | 3/2001 | Chalmers |
| 6,218,316 B1 | 4/2001 | Marsh |

| | | |
|---|---|---|
| 6,234,379 B1 | 5/2001 | Donges |
| 6,245,213 B1 | 6/2001 | Olsson et al. |
| 6,245,581 B1 | 6/2001 | Bonser et al. |
| 6,274,294 B1 | 8/2001 | Hines |
| 6,326,627 B1 | 12/2001 | Putvinski et al. |
| 6,329,256 B1 | 12/2001 | Ibok |
| 6,334,960 B1 * | 1/2002 | Willson et al. ............... 216/52 |
| 6,337,262 B1 | 1/2002 | Pradeep et al. |
| 6,355,198 B1 | 3/2002 | Kim et al. |
| 6,361,831 B1 | 3/2002 | Sato et al. |
| 6,383,928 B1 | 5/2002 | Eissa |
| 6,387,783 B1 | 5/2002 | Furukawa et al. |
| 6,388,253 B1 | 5/2002 | Su |
| 6,391,798 B1 | 5/2002 | DeFelice et al. |
| 6,407,340 B1 | 6/2002 | Wikstrom et al. |
| 6,423,207 B1 | 7/2002 | Heidari et al. |
| 6,455,411 B1 | 9/2002 | Jiang et al. |
| 6,482,742 B1 * | 11/2002 | Chou ......................... 438/690 |
| 6,489,068 B1 | 12/2002 | Kye |
| 6,503,829 B1 * | 1/2003 | Kim et al. .................. 438/637 |
| 6,514,672 B1 | 2/2003 | Young et al. |
| 6,517,995 B1 * | 2/2003 | Jacobson et al. ........... 430/320 |
| 6,518,168 B1 | 2/2003 | Clem et al. |
| 6,534,418 B1 | 3/2003 | Plat et al. |
| 6,541,360 B1 | 4/2003 | Plat et al. |
| 6,561,706 B1 | 5/2003 | Singh et al. |
| 6,565,928 B1 | 5/2003 | Sakamoto et al. |
| 6,632,742 B1 | 10/2003 | Yang et al. |
| 6,635,581 B1 | 10/2003 | Wong |
| 6,646,662 B1 | 11/2003 | Nebashi et al. |
| 6,677,252 B1 | 1/2004 | Marsh |
| 6,703,190 B1 | 3/2004 | Elian et al. |
| 6,716,767 B1 | 4/2004 | Shih et al. |
| 6,730,256 B1 | 5/2004 | Bloomstein et al. |
| 6,737,202 B1 | 5/2004 | Gehoski et al. |
| 6,743,713 B1 | 6/2004 | Mukherjee-Roy et al. |
| 6,767,983 B1 | 7/2004 | Fujiyama et al. |
| 6,770,852 B1 | 8/2004 | Steger |
| 6,776,094 B1 | 8/2004 | Whitesides et al. |
| 6,777,170 B1 | 8/2004 | Bloomstein et al. |
| 2002/0132482 A1 | 9/2002 | Chou |
| 2002/0167117 A1 | 11/2002 | Chou |
| 2003/0080471 A1 | 5/2003 | Chou |
| 2003/0081193 A1 | 5/2003 | White et al. |
| 2003/0113638 A1 | 6/2003 | Mancini et al. |
| 2003/0129542 A1 | 7/2003 | Shih et al. |
| 2004/0029041 A1 | 2/2004 | Shih et al. |
| 2004/0036201 A1 | 2/2004 | Chou et al. |

FOREIGN PATENT DOCUMENTS

| | | |
|---|---|---|
| JP | 02-24848 | 1/1990 |
| JP | 02-92603 | 4/1990 |
| WO | WO 92/17883 | 10/1992 |
| WO | WO 98/10121 | 3/1998 |
| WO | WO 99/45753 | 9/1999 |
| WO | WO 99/63535 | 12/1999 |
| WO | WO 00/21689 | 4/2000 |
| WO | WO 01/33232 | 5/2001 |
| WO | WO 01/33300 | 5/2001 |
| WO | WO 01/47003 A2 | 6/2001 |
| WO | WO 01/53889 | 7/2001 |
| WO | WO 01/63361 | 8/2001 |
| WO | WO 01/69317 | 9/2001 |
| WO | WO 01/79589 | 10/2001 |
| WO | WO 01/79591 | 10/2001 |
| WO | WO 01/79592 | 10/2001 |
| WO | WO 01/79933 | 10/2001 |
| WO | WO 01/90816 | 11/2001 |
| WO | WO 02/22916 | 3/2002 |
| WO | WO 02/24977 | 3/2002 |

OTHER PUBLICATIONS

U.S. Appl. No. 10/136,188, filed May 1, 2002, Volsin.
U.S. Appl. No. 10/178,947, filed Jun. 24, 2002, Watts et al.
U.S. Appl. No. 10/614,716, filed Jul. 8, 2002, Sreenivasan et al.
U.S. Appl. No. 10/191,749, filed Jul. 9, 2002, Watts et al.
U.S. Appl. No. 10/194,991, filed Jul. 11, 2002, Sreenivasan et al.
U.S. Appl. No. 10/194,410, filed Jul. 11, 2002, Sreenivasan et al.
U.S. Appl. No. 10/194,414, filed Jul. 11, 2002, Sreenivasan et al.
Stewart, "A Platform with Six Degrees of Freedom," Proc. of Inst. Mech. Engrs., 1965, pp. 371–378, vol. 180 pt. 1, No. 15.
Paros et al., "How to Design Flexure Hinges," Machine Design, Nov. 25, 1965, pp. 151–156.
Raibert et al., "Hybrid Position/Force Control of Manipulators," Transactions of the ASME, Journal of Dynamic Systems, Measurement and Control, Jun. 1981, pp. 126–133, vol. 102.
Lin, "Multi-Layer Resist Systems", Introduction of Microlithography, American Chemical Society, 1983, pp. 287–350, IBM T.J. Watson Research Center, Yorktown Heights, New York 10598.
Hogan, "Impedance Control: An Approach to Manipulation," Journal of Dynamic Systems, Measurement and Control, Mar. 1985, pp. 1–7, vol. 107.
Cowie, "Polymers: Chemistry and Physics of Modern Materials," 1991, pp. 408–409, $2^{nd}$ Ed, Chapman and Hall, a division of Routledge, Chapman and Hall, Inc., 29 West $35^{th}$ Street, NY, NY 10001–2291.
Hollis et al., "A Six-Degree-of-Freedom Magnetically Levitated Variable Compliance Fine Motion Wrist: Design, Modeling and Control," IEEE Transactions on Robotics and Automation, 1991, pp. 320–332, vol. 7, No. 3.
Tomita et al., "A 6-Axes Motion Control Method for Parallel-Linkage-Type Fine Motion Stage," Journal of Japan Society of Precision Engineering, 1992, pp. 118–124.
Slocum, "Precision Machine Design: Macromachine Design Philosophy and its Applicability to the Design of Micromachines," Micro Electro Mechanical Systems, 1992, pp. 37–42.
Krug et al., "Fine Patterning of Thin Sol-Gel Films," Journal of Non-Crystalline Solids, 1992, pp. 447–450, vol. 147 & 148.
Arai et al., "Calibration and Basic Motion of a Micro Hand Module," Proc. of IEEE, 1993, pp. 1660–1665.
Peng et al., "Compliant Motion Control of Kinematically Redundant Manipulators," IEEE Transactions on Robotics and Automation, Dec. 1993, pp. 831–837, vol. 9, No. 6.
Rong et al., "Design and Analysis of Flexure-Hinge Mechanism Used in Micro-Positioning Stages," ASME, PED. vol. 68–2, Manufacturing Science and Engineering, 1994, pp. 979–985, vol. 2.
Hashimoto et al., "Design and Characteristics of Parallel Link Compliant Wrist," IEEE International Conference on Robotics and Automation, 1994, pp. 2457–2462.
Merlet, "Parallel Manipulators: State of the Art Perspectives," Advanced Robotics, 1994, pp. 589–596, vol. 8.
Ananthasuresh et al., "Strategies for Systematic Synthesis of Compliant MEMS," ASME, DSC–vol. 55–2, Dynamic Systems and Control, 1994, pp. 677–686, vol. 2.

Chou et al., "Imprint of Sub–25 nm Vias and Trenches in Polymers," Applied Physics Letters, Nov. 20, 1995, pp. 3114–3116, vol. 67(21).

Arai et al., "Development of a New Parallel Manipulator with Fixed Linear Actuator," Proc. of Japan/USA Symposium on Flexible Automation, ASME, 1996, pp. 145–149, vol. 1.

Chou et al., "Imprint Lithography with 25–Nanometer Resolution," Science, Apr. 5, 1996, pp. 85–87, vol. 272.

Howell et al., "Loop–Closure Theory for the Analysis and Synthesis of Compliant Mechanisms," Journal of Mechanical Design, Mar. 1996, pp. 121–125, vol. 118.

Haisma et al., "Mold–Assisted Nanolithography: A Process for Reliable Pattern Replication," Journal of Vacuum Science and Technology, Nov./Dec. 1996, pp. 4124–4128, vol. B 14(6).

Chou et al., "Imprint Lithography with Sub–10nm Feature Size and High Throughput," Microelectronic Engineering, 1997, pp. 237–240, vol. 35.

Pernette et al., "Design of Parallel Robots in Microrobotics," Robotica, Jul.–Aug. 1997, pp. 417–420, vol. 15, No. 4.

Rong et al., "Dynamics of Parallel Mechanism with Direct Compliance Control," IEEE, 1997, pp. 1753–1758.

Mittal et al., "Precision Motion Control of Magnetic Suspension Acutator Using a Robust Nonlinear Compensation Scheme," IEEE/ASME Transactions on Mechatronics, Dec. 1997, pp. 268–280, vol. 2, No. 4.

Physik Instrumente, Product Catalog for Micropositioning from www.physikinstrumente.com, 1997.

Williams et al., "Six Degree of Freedom Mag–Lev Stage Development," SPIE, 1997, pp. 856–867, vol. 3051.

Lee et al., "An Ultraprecision Stage for Alignment of Wafers in Advanced Microlithography," Precision Engineering, 1997, pp. 113–122, vol. 21, Elsevier Science Inc., 655 Avenue of the Americas, NY, NY 10010.

Kanetomo et al., "Robot for Use in Ultrahigh Vacuum," Solid State Tech., Aug. 1997, pp. 63–64, 69–72.

Goldfarb et al., "Compliant Micromanipulator Design for Scaled Bilateral Telemanipulation of Small–Scale Environments," Proc. of the ASME, Dynamic Systems and Control Div., 1998, pp. 213–218, vol. 64.

Koseki et al., "Design and Accuracy Evaluation of High–Speed and High–Precision Parallel Mechanism," Proc. of the 1998 IEEE, Intl. Conf. on Robotics & Automation, May 1998, pp. 1340–1345, Leuven, Belgium.

Kim et al., "High Precision Magnetic Levitation Stage for Photolithography," Precision Engineering, 1998, pp. 66–77, vol. 22, Elsevier Science Inc., 655 Avenue of the Americas, NY, NY 10010.

Mansky et al., "Large–Area Domain Alignment in Block Copolymer Thin Films Using Electric Fields," Macromolecules, 1998, pp. 4399–4401, vol. 31.

Wang et al., "Passive Compliance Versus Active Compliance in Robot–Based Automated Assembly Systems," Industrial Robot, 1998, pp. 48–57, vol. 25, No. 1, MCB University Press.

Scheer et al., "Problems of the Nanoimprinting Technique for Nanometer Scale Pattern Definition," Journal of Vacuum Science and Technology, Nov./Dec. 1998, pp. 3917–3921, vol. B 16(6).

Xia et al., "Soft Lithography," Annu. Rev. Mater. Sci., 1998, pp. 153–184, vol. 28.

Xia et al., "Soft Lithography," Agnew. Chem. Int. Ed., 1998, pp. 550–575, vol. 37.

Tajbakhsh et al., "Three–Degree–of–Freedom Optic Mount for Extreme Ultraviolent Lithography," ASPE, 1998, pp. 359–362, vol. 18.

Lee et al., "Ultra Precision Positioning System for Servo Motor–Piezo Actuator Using the Dual Servo Loop and Digital Filter Implementation," ASPE, 1998, pp. 287–290, vol. 18.

Wu et al., "Large Area High Density Quantized Magnetic Disks Fabricated Using Nanoimprint Lithography," Journal of Vacuum Science and Technology, Nov./Dec. 1998, pp. 3825–3829, vol. B 16(6).

Ohya et al., "Development of 3–DOF Finger Module for Micro Manipulation," Proc. of the 1999 IEEE/RSJ, Intl. Conf. on Intelligent Robots and Systems, 1999, pp. 894–899.

Tanikawa et al., "Development of Small–Sized 3 DOF Finger Moldule in Micro Hand for Micro Manipulation," Proc. of the IEEE/RSJ, Intl. Conf. on Intelligent Robots and Systems, 1999, pp. 876–881.

Colburn, et al., "Step and Flash Imprint Lithography: A New Approach to High–Resolution Patterning", Proc. of SPIE, 1999, pp. 379–389, vol. 3676.

Lucas Aerospace, Free–Flex Pivot Catalog, 1999.

Goldfarb et al., "A Well–Behaved Revolute Flexure Joint for Compliant Mechanism Design," Journal of Mech. Design, Sep. 1999, pp. 424–429, vol. 121.

Geodetic Technology, G1000–PC Power Series Specifications, 1999, from www.hexapods.com.

Hexel Corporation, Tomato 2000 System Specifications, 1999, from www. Hexel.com.

Physik Instruments, PI Online–Catalog, 1999, from www. Physikinstruments.com.

Chou et al., "Lithographically–Induced Self Assembly of Periodic Polymer Micropillar Arrays," Journal of Vacuum Science and Technology, Nov./Dec. 1999, pp. 3197–3202, vol. B 17(6).

Ruchoeft et al., "Patterning Curved Surfaces: Template Generation by Ion Beam Proximity Lithography and Relief Transfer by Step and Flash Imprint Lithography," Journal of Vacuum Science and Technology, 1999, pp. 2965–2982, vol. 17.

Vanderbilt University Office of Transfer Technology, VU 9730 Specifications for Improved Flexure Device: 2001, from www.vanderbilt.com.

Stix, "Getting More from Moore's," Scientific American, 2001, from www.scientificamerican.com.

Trilogy Systems, Linear Motors 310 Specifications, 2001, from www.trilogysystems.com.

Chol et al., "Design of Orientation Stages for Step and Flash Imprint Lithography," Precision Engineering, Journal of the International Societies for Precision Engineering and Nanotechnology, 2001, pp. 192–199, vol. 25.

Braeuer et al., "Precise Polymer Micro–Optical Systems," MRS Bulletin, Jul. 2001, pp. 519–522.

Chou, "Nanoimprint Lithography and Lithographically Induced Self–Assembly," MRS Bulletin, Jul. 2001, pp. 512–517.

Mirkin et al., "Emerging Methods for Micro–and Nanofabrication," MRS Bulletin, Jul. 2001, pp. 506–509.

Gokan et al., "Dry Etch Resistance of Organic Materials," J. Electrochem. Soc. 130:1, 143–146 (Jan. 1983).

Kotachi et al., "Si–Containing Positive Resis for ArF Laser Lithography," J. PhotopolymerSci. Tevhnol. 8(4) 615–622, 1995.

Krauss et al., "Fabrication of Nanodevices Using Sub–25nm Imprint Lithography," Appl. Phys. Lett. 67(21), 3114–3116, 1995.

Nguyen, A. Q., "Asymmetric Fluid–Structure Dynamics in Nanoscale Imprint Lithography," University of Texas at Austin, Aug. 2001.

Abstract of Japanese Patent 63–138730.

Abstract of Japanese Patent 55–88332.

Abstract of Japanese Patent 57–7931.

Abstract of Japanese Patent 02–92603.

Translation of Japanese Patent 02–92603.

Abstract of Japanese Patent 02–24848.

Translation of Japanese Patent 02–24848.

Heidari et al., "Nanoimprint Lithography at the 6 in. Wafer Scale," Journal of Vacuum Science Technology, Nov./Dec. 2000, pp. 3557–3560, vol. B, No. 18(6)/.

NERAC.COM Retro Search, "Reduction of Dimension of Contact Holes", Aug. 31, 2004.

NERAC.COM Retro Search, "Trim Etching of Features Formed on an Organic Layer", Sep. 2, 2004.

NERAC.COM Retro Search, "Multi–Layer Resists", Sep. 2, 2004.

Hu et al., "Flourescence Probe Techniques (FPT) for Measuring the Relative Efficiencies of Free–Radical Photoinitiators", s0024–9297(97)01390–9;"Macromolecules" 1998, vol. 31, No. 13, pp. 4107–4113, 1998 American Chemical Society. Published on Web May 29, 1998.

Feynman, Richard P., "There's Plenty of Room at the Bottom—An Invitation to Enter a New Field of Physics," 12 pp online Retreived Sep. 23, 2004 from URI:http://www.zyvex.com/nanotech/feynman.html.

Communication Relating to the Results of the Partial International Search; International Appl. No. PCT/US2002/015551.

Papirer et al., "The Graftijng of Perfluorinated Silanes onto the Surface of Silica: Characterization by Inverse Gas Chromatography," Aug. 1993, pp. 238–242, vol. 159, Issue 1.

Abstract of Papirer et al., "The Graftijng of Perfluorinated Silanes onto the Surface of Silica: Characterization by Inverse Gas Chromatography," Aug. 1993, pp. 238–242, vol. 159, Issue 1.

Hiral et al., "Mold Surface Treatment for Imprint Lithography," Aug. 2001, pp. 457–462, vol. 14, No. 3.

Abstract of Hiral et al., "Mold Surface Treatment for Imprint Lithography," Aug. 2001, pp. 457–462, vol. 14, No. 3.

Sung et al., "Micro/nano–tribological Characteristics of Self–Assembled Monolayer and its Application in Nano–Structure Fabrication," Jul. 2003, pp. 808–818, vol. 255, No. 7.

Abstract of Sung et al., "Micro/nano–tribological Characteristics of Self–Assembled Monoloayer and its Application in Nano–Structure Fabrication," Jul. 2003, pp. 808–818, vol. 255, No. 7.

Roos et al., "Nanoimprint Lithography with a Commerical 4 Inch Bond System for Hot Embossing," Oct. 2001, pp. 427–435, vol. 4343.

Abstract of Roos et al., "Nanoimprint Lithography with a Commerical 4 Inch Bond System for Hot Embossing," Oct. 2001, pp. 427–435, vol. 4343.

* cited by examiner

METHOD FOR FABRICATING BULBOUS-SHAPED VIAS

BACKGROUND OF THE INVENTION

The field of invention relates generally to imprint lithography. More particularly, the present invention is directed to imprint lithographic techniques to form vias suitable for fabricating gate electrodes.

The semiconductor processing industry continues to strive for larger production yields while increasing the operational performance of circuits formed on a substrate. For example, great strides have been undertaken to improve the performance of field-effect transistors. To that end, new gate structures have been developed wherein the gate electrode has a V-shaped cross-section. The V-shaped cross-section of the gate electrode results in a reduced gate length and an enlarged cross-sectional area to prevent an increase in the gate resistance.

U.S. Pat. No. 5,804,474 to Sakaki et al. discloses processes of forming V-shaped gate electrodes employing standard semiconductor fabrication techniques. Important to obtaining the proper shape of the gate electrode is forming a via of complex shape, because the via is used to define the shape of the gate electrode. As a result, Sakaki et al. includes the steps forming a first gate opening in a first resist between a source and a drain formed on a semiconductor substrate. Dummy openings are formed near both sides of the first gate opening. By baking the first resist, convex portions thereof, which rise steeply, are formed between the first gate opening and the dummy openings. A second resist is formed to overlay the first resist convex portions and the first gate opening. The second resist is removed from the first gate opening, and a second gate opening larger than the first gate opening is formed in the second resist above the first gate opening. Metal for the V-shaped gate electrode is deposited through the second gate opening on the sides of the first resist convex portions rising steeply from the bottom of the first gate opening. A lift-off technique is performed to leave the V-shaped gate electrode by dissolving the first resist convex portions and the second resist.

From the foregoing it is seen that standard semiconductor processing techniques are complicated and time consuming thereby increasing the per-unit cost of manufacturing devices including the V-shaped gate electrode. A processing technique that may overcome the drawbacks of the standard semiconductor processes while improving the operation characteristics of the gate electrode structure is known as imprint lithography.

An exemplary imprint lithography process is disclosed in U.S. Pat. No. 6,334,960 to Willson et al. Willson et al. disclose a method of forming a relief image in a structure. The method includes providing a substrate having a planarization layer. The planarization layer is covered with a polymerizable fluid composition. A mold makes mechanical contact with the polymerizable fluid. The mold includes a relief structure, and the polymerizable fluid composition fills the relief structure. The polymerizable fluid composition is then subjected to conditions to solidify and polymerize the same, forming a solidified polymeric material on the planarization layer that contains a relief structure complimentary to that of the mold. The mold is then separated from the solid polymeric material such that a replica of the relief structure in the mold is formed in the solidified polymeric material. The planarization layer and the solidified polymeric material are subjected to an environment to selectively etch the planarization layer relative to the solidified polymeric material such that a relief image is formed in the planarization layer. Advantages with this imprint lithography process are that it affords fabrication of structures with minimum feature dimensions that are far smaller than is provided employing standard semiconductor process techniques.

It is desired, therefore, to provide a process for fabricating vias to facilitate formation of gate electrodes employing imprint lithography.

SUMMARY OF THE INVENTION

The present invention includes a method for fabricating bulbous-shaped vias on a substrate, having a surface, by disposing, on the substrate, a polymerizable fluid composition. A mold is placed in contact with the polymerizable fluid composition. The mold includes a relief structure on a surface thereof to create a bi-level recess in a layer of the polymerizable fluid composition. The relief structure may either be a projection from the mold, for negative imprint lithography processes, or a recession in the mold, for positive imprint processes, as desired. The bi-level recess includes a nadir and shoulders spaced-apart from the nadir. The polymerizable fluid composition is subjected to conditions to cause polymerization, forming a polymerized layer having a solidified bi-level indentation. An opening to the surface of the substrate is formed by selectively removing material disposed on the substrate, with the material including a sub-section of the polymerized material proximate to the bi-level indentation. In a further embodiment a conductive layer may be disposed in the opening to form a contact. A lift-off process may be employed to remove the polymerized layer. The contact may form the gate electrode of a field-effect transistor. To that end, source and drain regions may be formed in the substrate.

In still further embodiments, the method for fabricating vias on a substrate, having a surface, includes disposing a planarization layer on the surface. Disposed adjacent to the planarization layer is a polymerizable fluid composition. Contact is made with the polymerizable fluid composition by a mold having a relief structure on a surface thereof. As before, the relief structure may include a projection, a recession or both, depending upon the application. In this manner, a recess is made in a layer of the polymerizable fluid composition. The recess includes a nadir. The polymerizable fluid composition is subjected to conditions to achieve polymerization. In this manner a polymerized layer is formed having a solidified indentation, with the planarization layer positioned between the surface and the polymerized layer. An opening to the surface of the substrate is formed by removing material disposed on the substrate. Specifically, the material removed includes the sub-section of the polymerized layer positioned proximate to the solidified indentation and a sub-portion of the planarization layer in superimposition with the nadir.

In yet another embodiment, the method for fabricating vias on a substrate, having a surface, includes disposing an etch-stop layer on the surface. A planarization layer is disposed onto the etch-stop layer. A polymerizable fluid composition is disposed on the planarization layer. Contact is made between the polymerizable fluid composition and the mold. The relief structure on the mold creates a bi-level recess in a layer of the polymerizable fluid composition. The bi-level recess includes a nadir and shoulders spaced-apart from the nadir. The polymerizable fluid composition is then subjected to conditions to polymerize the polymerizable fluid composition. This forms a polymerized layer having a solidified bi-level indentation, with the etch-stop layer positioned between the surface and the planarization layer. The etch-stop, planarization and polymerized layers, define a composite layer. The composite layer is subjected to a non-selective anisotropic etch process to form a relief pattern in the planarization layer. The relief pattern has a profile that matches the profile of the solidified bi-level indentation, which includes relief shoulders and a relief nadir. The relief pattern is then subjected to etch processes that form a bulbous-shaped via and exposes a sub-portion of the etch-stop layer that is in superimposition with the relief nadir. The sub-portion is subjected to conditions to change the properties of the same. Thereafter, the sub-portion is removed to expose a region of the surface in superimposition therewith and increase the depth of the bulbous-shaped via.

DETAILED DESCRIPTION OF THE PREFERRED EMBODIMENTS

Figure 1:
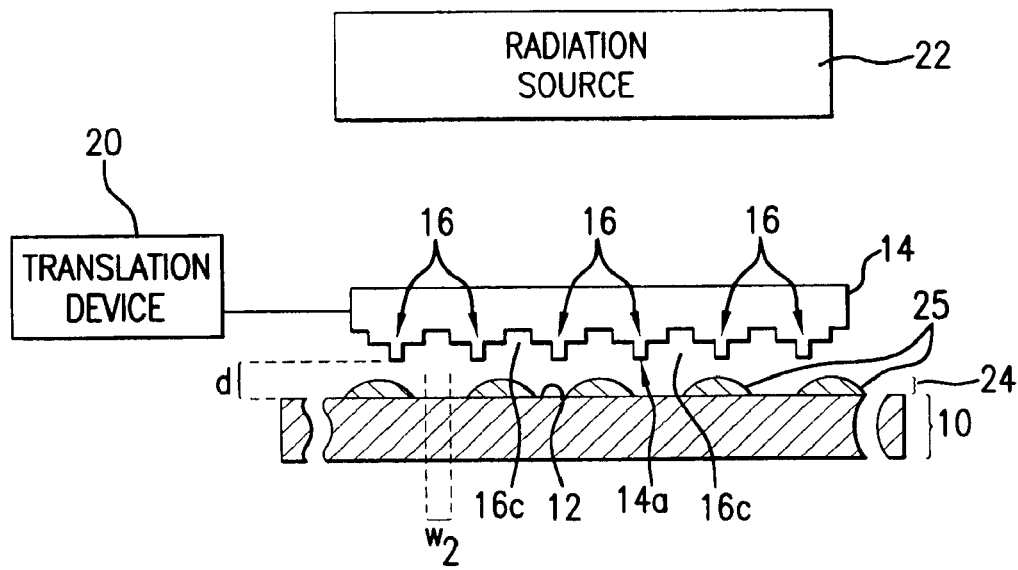
FIG. 1 is a simplified elevation view of a lithographic system in accordance with the present invention.

Referring to FIG. 1, a lithographic system in accordance with an embodiment of the present invention includes a substrate 10, having a substantially planar region shown as surface 12. Disposed opposite substrate 10 is an imprint device 14 having a plurality of features 16 thereon. Each of features 16 includes a protrusion 16a and a pair of shoulders 16b positioned between protrusion 16a and a surface 14a of imprint device 14, shown more clearly in FIG. 2.

Referring again to FIG. 1, in the present embodiment, adjacent features 16 are spaced-apart to provide a cross-section of imprint device 14 with a plurality of stepped molds. However, features 16 may correspond to virtually any feature required to create an integrated circuit. A translation mechanism 20 is connected between imprint device 14 and substrate 10 to vary a distance "d" between imprint device 14 and substrate 10. A radiation source 22 is located so that imprint device 14 is positioned between radiation source 22 and substrate 10. Radiation source 22 is configured to impinge radiation upon substrate 10. To realize this, imprint device 14 is fabricated from material that allows it to be substantially transparent to the radiation produced by radiation source 22.

Figure 3:
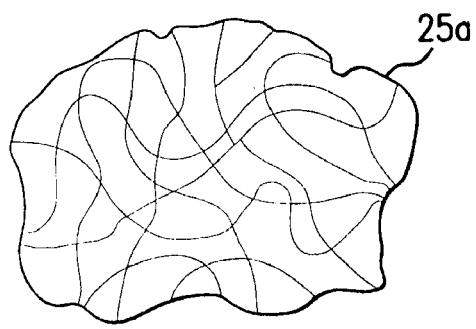
FIG. 3 is a simplified representation of material from which an imprint layer, shown in FIG. 1, is comprised before being polymerized and cross-linked.

Referring to both FIGS. 1 and 3, an imprint layer 24 is disposed adjacent to surface 12, between substrate 10 and imprint device 14. Although imprint layer 24 may be deposited using any known technique, in the present embodiment, imprint layer 24 is a polymerizable fluid composition deposited as a plurality of spaced-apart discrete beads 25 of material 25a on substrate 10, discussed more fully below. Imprint layer 24 is formed from a material 25a that may be selectively polymerized and cross-linked to record a desired pattern. Material 25a is shown in FIG. 4 as being cross-linked at points 25b, forming cross-linked polymer material 25c.

Figure 5:
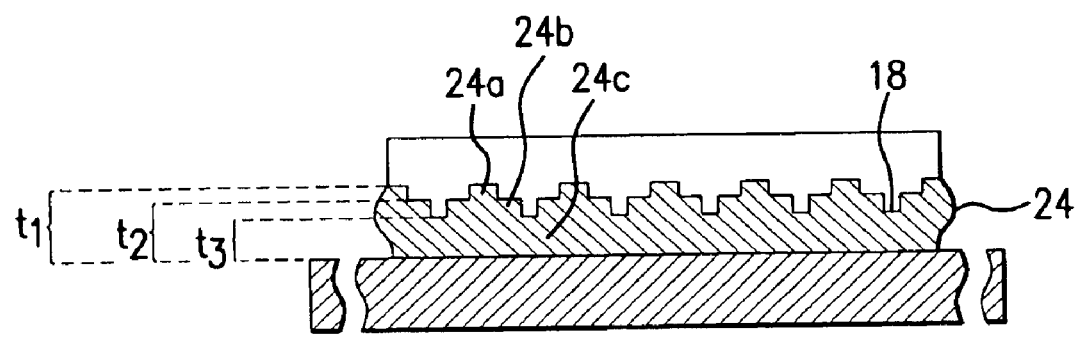
FIG. 5 is a simplified elevation view of an imprint device, shown in FIG. 1, in mechanical contact with an imprint layer disposed on a substrate, in accordance with one embodiment of the present invention.

Referring to FIGS. 1, 3 and 5, the pattern recorded by imprint layer 24 is produced, in part, by mechanical contact with imprint device 14. To that end, translation mechanism 20 reduces the distance "d" to allow imprint layer 24 to come into mechanical contact with imprint device 14, spreading beads 25 so as to form imprint layer 24 with a contiguous formation of material 25a over surface 12. In one embodiment, distance "d" is reduced to allow sub-portions of imprint layer 24 to ingress into and fill regions 16c between features 16. To that end, material 25a is provided with the requisite viscosity to completely fill regions 16c in a timely manner, while covering surface 12 with a contiguous formation of material 25a, on the order of a few milliseconds to a few seconds.

This leaves sub-portions 24a in superimposition with surface 14a with a thickness $t_1$, sub-portion 24b, in superimposition with shoulders 16b with a thickness, $t_2$, and sub-portions 24c in superimposition with protrusions 16a with a thickness $t_3$. Thicknesses "$t_1$", "$t_2$" and "$t_3$" may be any thickness desired, dependent upon the application. In the present embodiment, thicknesses "$t_1$", "$t_2$" and "$t_3$" and features 16 are dimensions to facilitate formation of vias having bulbous-shaped cross-sections suited for formation of T-gate electrodes or contacts.

Figure 4:
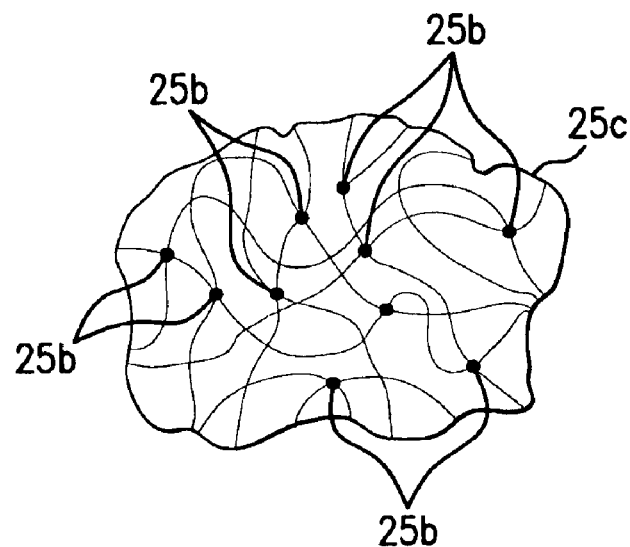
FIG. 4 is a simplified representation of cross-linked polymer material into which the material shown in FIG. 3 is transformed after being subjected to radiation.

Referring to FIGS. 1, 3, 4, after a desired distance "d" has been reached, radiation source 22 produces actinic radiation that polymerizes and cross-links material 25a, forming cross-link polymer material 25c. As a result, the composition of imprint layer 24 transforms from material 25a to material 25c, which is a solid. Specifically, material 25c is solidified to provide surface 24d of imprint layer 24 with a shape conforming to a shape of a surface of imprint device 14, discussed more fully below with respect to FIG. 6.

Figure 6:
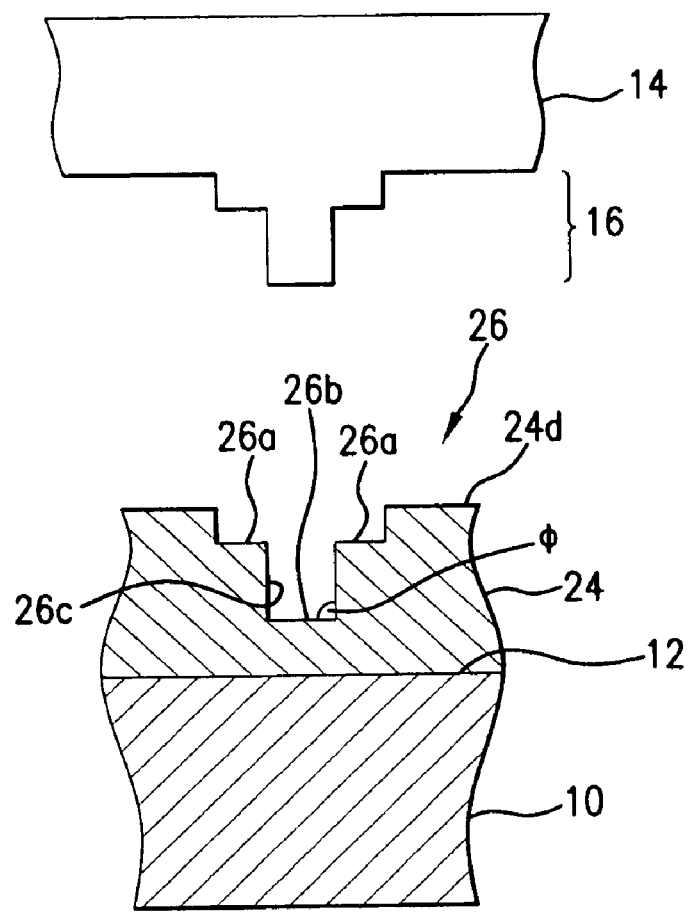
FIG. 6 is a detailed elevation view of a subsection of the imprint device spaced-apart from the imprint layer, shown in FIG. 5, after formation of a bi-level impression in the imprint layer, in accordance with one embodiment of the present invention.

Referring to FIG. 6, feature 16 of imprint device 14 creates a bi-level recess 26 in imprint layer 24. Bi-level recess 26 includes shoulders 26a and a nadir 26b, with shoulders 26a being disposed between nadir 26b and surface 24d. After polymerizable bi-level recess 26 becomes a solidified bi-level indentation 127 shown more clearly in FIG. 8. Imprint layer 24 is subjected to additional processing to complete the patterning of substrate 10, discussed more fully below.

Referring again to FIGS. 1, 3 and 4, an exemplary radiation source 22 may produce ultra-violet radiation. Other radiation sources may be employed, such as thermal, electromagnetic and the like. The selection of radiation employed to initiate the polymerization of the material in imprint layer 24 is known to one skilled in the art and typically depends on the specific application which is desired. After imprint layer 24 is transformed to consist of cross-linked polymer material 25c, translation mechanism 20 increases the distance "d" so that imprint device 14 and imprint layer 24 are spaced-apart. Imprint device 14 may be formed from various conventional materials, such as, but not limited to, quartz, silicon, organic polymers, siloxane polymers, borosilicate glass, fluorocarbon polymers, metal, and combinations of the above.

Referring to both FIGS. 1 and 3, the characteristics of material 25a are important to efficiently pattern substrate 10 in light of the unique deposition process employed. As mentioned above, material 25a is deposited on substrate 10 as a polymerizable fluid composition consisting of a plurality of discrete and spaced-apart beads 25. The combined volume of beads 25 is such that the material 25a is distributed appropriately over an area of surface 12 where imprint layer 24 is to be formed. As a result, imprint layer 24 is spread and patterned concurrently, with the pattern being subsequently set by exposure to radiation, such as ultra-violet radiation. As a result of the deposition process it is desired that material 25a have certain characteristics to facilitate rapid and even spreading of material 25a in beads 25 over surface 12 so that all thicknesses "$t_1$" are substantially uniform and all thicknesses "$t_2$" are substantially uniform, and all thicknesses "$t_3$" are substantially uniform. The desirable characteristics include having a viscosity approximately that of water, ($H_2O$), 1 to 2 centepoise (csp) or less, as well as the ability to wet surface of substrate 10 to avoid subsequent pit or hole formation after polymerization. To that end, in one example, the wettability of imprint layer 24, as defined by the contact angle method, should be such that the angle, $\theta_1$, is defined as follows:

$$0 \geq \theta < 75°$$

With these two characteristics being satisfied, imprint layer 24 may be made sufficiently thin while avoiding formation of pits or holes in the thinner regions.

Referring to FIGS. 3, 4 and 6, another characteristic that it is desired for material 25a to possess is thermal stability such that the variation in an angle Φ, measured between two transverse surfaces of bi-level recess 26, e.g., nadir 26b and a sidewall 26c thereof, does not vary more than 10% after being heated to 75° C. for thirty (30) minutes. Additionally, material 25a should transform to material 25c, i.e., polymerize and cross-link, when subjected to a pulse of radiation containing less than 5 J cm-2. In the present example, polymerization and cross-linking was determined by analyzing the infrared absorption of the "C=C" bond contained in material 25a. Additionally, it is desired that surface 12 be relatively inert toward material 25a, such that less than 500 nm of surface 12 be dissolved as a result of sixty seconds of contact with material 25a. It is further desired that the wetting of imprint device 14 by imprint layer 24 be minimized. To that end, the wetting angle, θ, should be greater than 75°. Finally, should it be desired to vary an etch rate differential between imprint layer 24 and substrate 10, an exemplary embodiment of the present invention would demonstrate an etch rate that is 20% less than the etch rate of an optical photo-resist (not shown) exposed to an oxygen plasma.

The constituent components that form material 25a to provide the aforementioned characteristics may differ. This results from substrate 10 being formed from a number of different materials. As a result, the chemical composition of surface 12 varies dependent upon the material from which substrate 10 is formed. For example, substrate 10 may be formed from silicon, plastics, gallium arsenide, mercury telluride, and composites thereof. Additionally, substrate 10 may include one or more layers, e.g., dielectric layer, metal layers, semiconductor layer and the like.

Referring to FIGS. 3 and 4, in one embodiment of the present invention the constituent components of material 25a consist of acrylated monomers or methacrylated monomers that are not silyated, a cross-linking agent, and an initiator. The non-silyated acryl or methacryl monomers are selected to provide material 25a with a minimal viscosity, e.g., viscosity approximating the viscosity of water (1–2 cps) or less. The cross-linking agent is included, even though the size of these molecules increases the viscosity of material 25a, to cross-link the molecules of the non-silyated monomers, providing material 25a with the properties to record a pattern thereon having very small feature sizes, on the order of a few nanometers and to provide the aforementioned thermal stability for further processing. To that end, the initiator is provided to produce a free radical reaction in response to radiation, causing the non-silyated monomers and the cross-linking agent to polymerize and cross-link, forming a cross-linked polymer material 25c. In the present example, a photo-initiator responsive to ultra-violet radiation is employed. In addition, if desired, a silyated monomer may also be included in material 25a to control the etch rate of the resulting cross-linked polymer material 25c, without substantially affecting the viscosity of material 25a.

Examples of non-silyated monomers include, but are not limited to, butyl acrylate, methyl acrylate, methyl methacrylate, or mixtures thereof. The non-silyated monomer may make up approximately 25–60% by weight of material 25a. It is believed that the monomer provides adhesion to an underlying organic planarization layer, discussed more fully below.

The cross-linking agent is a monomer that includes two or more polymerizable groups. In one embodiment, polyfunctional siloxane derivatives may be used as a crosslinking agent. An example of a polyfunctional siloxane derivative is 1,3-bis(3-methacryloxypropyl)-tetramethyl disiloxane. Another suitable cross-linking agent consists of ethylene diol diacrylate. The cross-linking agent may be present in material 25a in amounts of up to 20% by weight, but is more typically present in an amount of 5–15% by weight.

The initiator may be any component that initiates a free radical reaction in response to radiation, produced by radiation source 22, shown in FIG. 1, impinging thereupon and being absorbed thereby. Suitable initiators may include, but are not limited to, photo-initiators such as 1-hydroxycyclohexyl phenyl ketone or phenylbis(2,4,6-trimethyl benzoyl) phosphine oxide. The initiator may be present in material 25a in amounts of up to 5% by weight, but is typically present in an amount of 1–4% by weight.

Were it desired to include silylated monomers in material 25a, suitable silylated monomers may include, but are not limited to, silyl-acryloxy and silyl methacryloxy derivatives. Specific examples are methacryloxypropyl tris(trimethylsiloxy)silane and (3-acryloxypropyl)tris(trimethoxysiloxy)-silane. Silylated monomers may be present in material 25a in amounts from 25–50% by weight. The curable liquid may also include a dimethyl siloxane derivative. Examples of dimethyl siloxane derivatives include, but are not limited to, (acryloxypropyl) methylsiloxane dimethylsiloxane copolymer.

Referring to both FIGS. 1 and 3, exemplary compositions for material 25a are as follows:

COMPOSITION 1 n-butyl acrylate+(3-acryloxypropyltristrimethylsiloxy) silane+1,3-bis(3-methacryloxypropyl)tetramethyldisiloxane

COMPOSITION 2 t-n-butyl acrylate+(3-acryloxypropyltristrimethylsiloxy) silane+Ethylene diol diacrylate

COMPOSITION 3 t-butyl acrylate+ methacryloxypropylpentamethyldisiloxane+1,3-bis(3-methacryloxypropyl)tetramethyldisiloxane The above-identified compositions also include stabilizers that are well known in the chemical art to increase the operational life, as well as initiators.

The compositions described above provide suitable viscosity and cross-linking required to efficiently pattern using imprint lithography and are based upon the realization that the poly-functional molecules increases viscosity less than experimentally anticipated. Specifically, a dearth of information exists relating to viscosity of materials as a function of the viscosity of the underlying components that form the material. As a result, an approximately linear function of composition was obtained by comparing 1/viscosity vs. the weight fraction of a molecule component in a material. A theoretical model of all components in a material was obtained by calculating 1/viscosity, based upon the weight percentage of the composition in the material 25a. The theoretical viscosity was then compared with the measured viscosity. It was found that certain di-functional acrylates had a measured viscosity that was less than the theoretical viscosity, defining a viscosity differential. Similarly, the viscosity differential of the mono-functional molecules was such that the theoretical viscosity was greater than the measured viscosity. However, it was found that the viscosity differential of the di-functional molecules was nearly twice that of the mono-functional molecules. As a result, it was determined that cross-linking of material 25a may be augmented without increasing the viscosity of the same too greatly.

Figure 2:
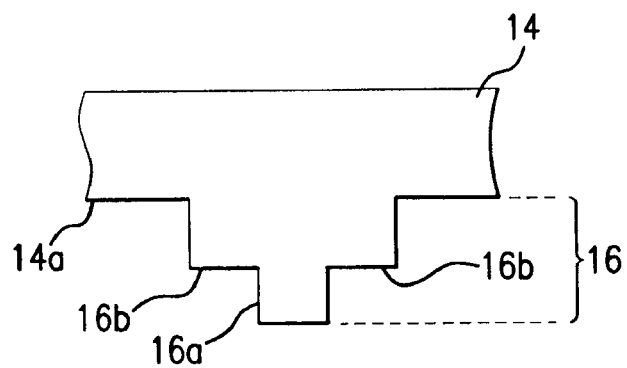
FIG. 2 is a detailed view of a feature on an imprint device, shown in FIG. 1.

Additionally, to ensure that imprint layer 24 does not adhere to imprint device 14, surface 14a, shown in FIG. 2, may be treated with a modifying agent. One such modifying agent is a release layer (not shown) formed from a fluorocarbon silylating agent. Release layer (not shown) and other surface modifying agents, may be applied using any known process, for example, processing techniques that may include chemical vapor deposition method, physical vapor deposition, atomic layer deposition or various other techniques, brazing and the like.

Figure 7:
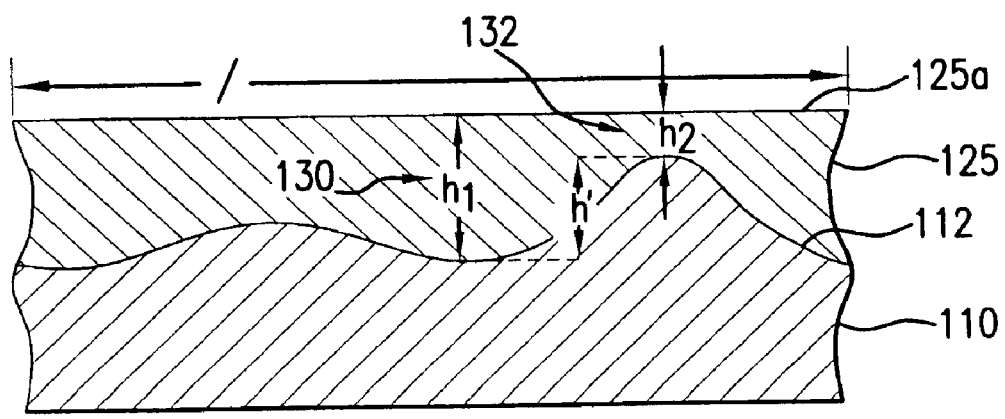
FIG. 7 is a cross-sectional view of a substrate upon which a bulbous via will be formed in accordance with a second alternate embodiment of the present invention.

Referring to FIG. 7, typically, substrate 110 is not planar. This is commonly found with substrates 110 formed from gallium arsenide (GAs) or indium phosphide (InP). For example, substrate 110 is shown with variations in surface height h, as much as 1 micron over a 20 mm length 1.

Figure 8:
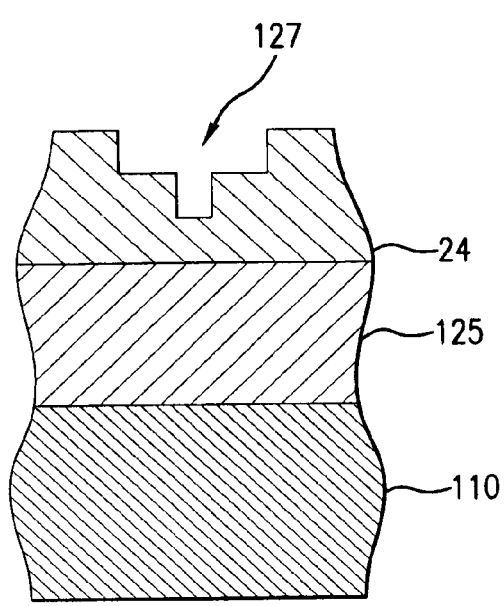
FIG. 8 is a detailed elevation view of the subsection of the substrate shown in FIG. 7, after formation of a bi-level impression in the imprint layer, with the imprint layer being disposed atop of a planarization layer.

Referring to both FIGS. 7 and 8, to facilitate formation of bulbous-shaped vias on substrates that present extreme topologies, such as substrate 110, a planarization layer 125 is employed. Planarization layer 125 is disposed atop of surface 112 of substrate 110 and functions to present a planar surface 125a upon which subsequent processing may occur. To that end, planarization layer 125 may be formed from a number of differing materials, such as, for example, thermoset polymers, thermoplastic polymers, polyepoxies, polyamides, polyurethanes, polycarbonates, polyesters, and combinations thereof. In the present example, planarization layer 125 is formed from an aromatic material so as to possess a continuous, smooth, relatively defect-free surface that may exhibit excellent adhesion to the imprint layer 24. Specifically, surface 125a presents a planar region upon which imprint layer 24 may be disposed and bi-level indentation 127 is formed. Planarization layer 125 may be disposed on substrate 110 using any known deposition technique. In the present example, planarization layer 125 is disposed on substrate 110 using spin-on techniques.

Figure 9:
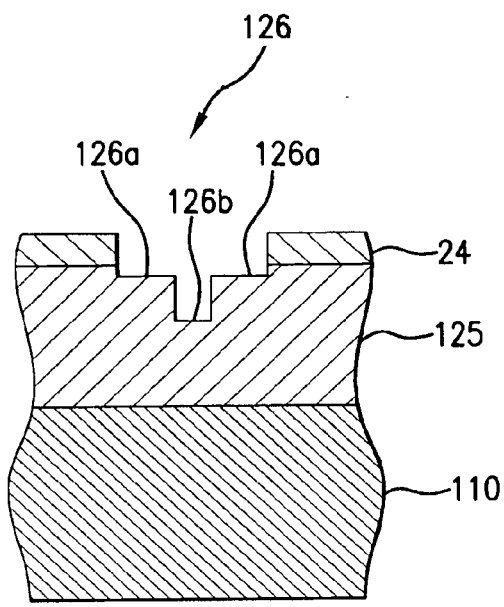
FIG. 9 is a detailed elevation view of the subsection shown in FIG. 8, after polymerization of imprint layer and subsequent anisotropic non-selective etching of the bi-level impression, imprint layer and planarization layer.

Referring to FIG. 9, an anisotropic non-selective etch is performed, removing substantially all of imprint layer 24, effectively transferring bi-level indentation 127, shown in FIG. 8, into planarization layer 125 to form bi-level relief pattern 126. Any known etch process may be employed, e.g., an oxygen plasma etch process. As shown, relief pattern 126 includes shoulders 126a and nadir 126b, formed into planarization layer 125. A selective anisotropic etch is performed to remove nadir 126b and expose a region 112a of surface 112 on substrate 110, shown more clearly in FIG. 10. The etch process may be any known, such as a plasma etch employing fluorocarbon gases, such as $CF_3$ or $CF_4$.

Figure 10:
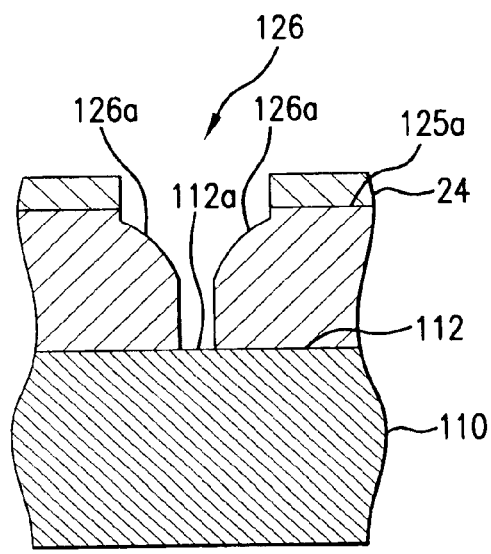
FIG. 10 is a detailed elevation view of the subsection shown in FIG. 9, after a selective isotropic etch.

As shown in FIG. 10, the selective anisotropic etch may also result in rounding of shoulders 126a, while a portion of imprint layer 24 remains on surface 125a. This is followed by a selective isotropic etch of relief pattern 126, that produces a bulbous-shaped via 128, which extends from an opening 128a in imprint layer 24, terminating proximate to substrate 110, shown more clearly in FIG. 11.

Figure 11:
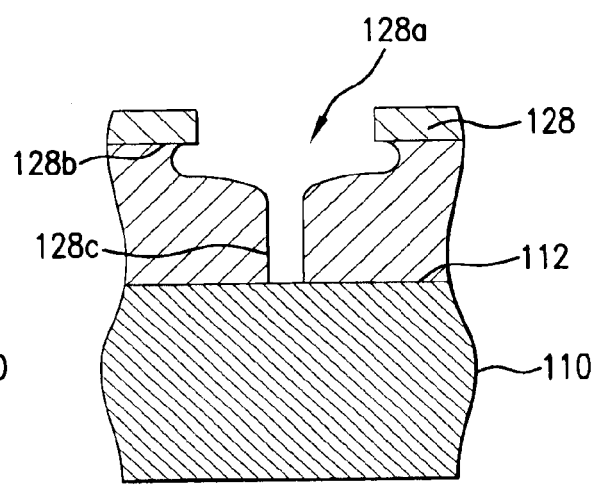
FIG. 11 is a detailed elevation view of the subsection shown in FIG. 10, after an additional selective isotropic etch to form a bulbous via.

Referring to FIG. 11, bulbous-shaped via 128 has two distinct regions, a curved bulb region 128b and a narrow waist region 128c. The curved bulb region 128b extends from opening 128a toward surface 112, terminating in narrow waist region 128c. Subsequent processing may be employed, to provide a conductive contact in bulbous-shaped via 128 or to provide a T-shaped gate.

Figure 12:
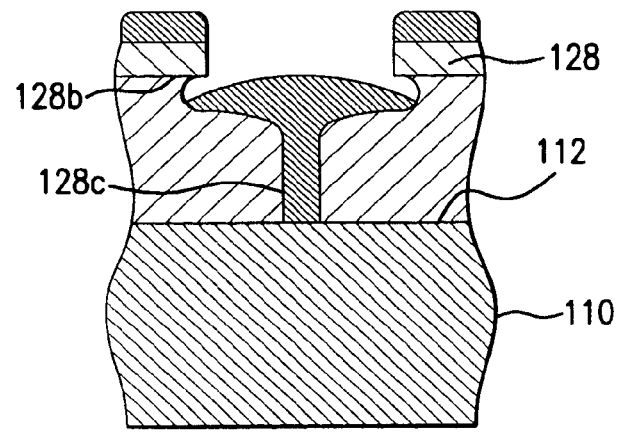
FIG. 12 is a detailed elevation view of the subsection shown in FIG. 11, after deposition of a conductive layer.
Figure 13:
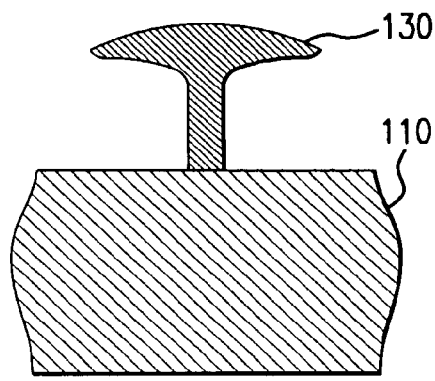
FIG. 13 is a detailed elevation view of the subsection shown in FIG. 12, after a lift-off process, leaving a T-shaped conductive contact atop of a substrate.

For example, referring to FIG. 12, bulbous-shaped via 128 is suitable for use in forming T-shaped gates. To that end, a conductive layer is deposited, forming a T-shaped gate 130 in bulbous-shaped via 128, as well as a layer 132 covering surface 24d of imprint layer 24. Any suitable conductive material may be employed, e.g., polysilicon or refractory metals. Thereafter, imprint layer 24 and layer 132 are removed employing standard lift-off techniques, leaving T-shaped gate 130 extending from substrate 110, shown more clearly in FIG. 13.

Referring again to FIG. 7, another difficulty presented by the extreme topography of substrate 110 concerns etching of planarization layer 125. Specifically, consider the situation where a first via is to be formed in region 130 and a second via is formed in region 132. The height differential between surface 112 and surface 125a is defined as follows:

$$\Delta h = |h_1 - h_2|$$

where $h_1$ is the distance between surface 112 in superimposition with region 130 and surface 125a, and $h_2$ is a distance between surface 112 in superimposition with region 132 and surface 125a.

Height differential $\Delta h$ may result in the via (not shown) formed in region 130 not extending to surface 112. This occurs as a result of ending an etch process once the via (not shown) formed in region 132 reaches surface 112. Alternatively, the via (not shown) formed in region 132 may extend into substrate 110, resulting in substantial etching of the same. This occurs as a result of ending an etch process once the via (not shown) formed in region 130 reaches surface 112.

Figure 14:
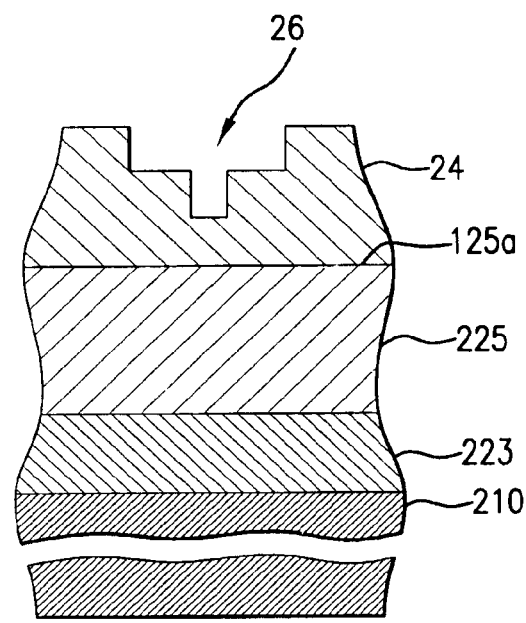
FIG. 14 is a detailed elevation view of the subsection of the substrate shown in FIG. 7, after formation of a bi-level impression in the imprint layer, with an etch-stop layer being disposed between the planarization layer and the substrate, in accordance with an alternate embodiment.
Figure 15:
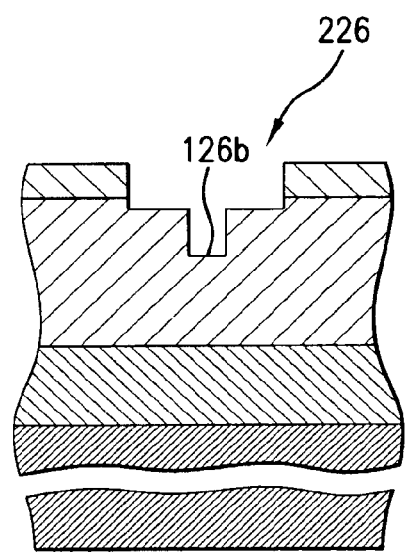
FIG. 15 is a detailed elevation view of the subsection shown in FIG. 14, after polymerization of imprint layer and subsequent anisotropic non-selective etching of the bi-level impression, imprint layer and planarization layer.

Referring to FIG. 14, to avoid both of the situations mentioned above, another embodiment of the present invention employs an etch-stop layer 223 disposed between planarization layer 225 and substrate 210. Etch-stop layer 223 is formed to be resistant to etching steps employed to form the bulbous via (not shown). As mentioned above, planarization layer 225 presents a planar surface 125a upon which imprint layer 24 is disposed. Bi-level indentation 127 is formed into imprint layer 24, as discussed above. An anisotropic non-selective etch is performed, removing substantially all of imprint layer 24, effectively transferring bi-level indentation 127 into planarization layer 225 to form relief pattern 226, shown more clearly in FIG. 15. A selective anisotropic etch is performed to remove nadir 126b and expose a region 223a of etch-stop layer 223, shown more clearly in FIG. 16.

Figures 16, 17:
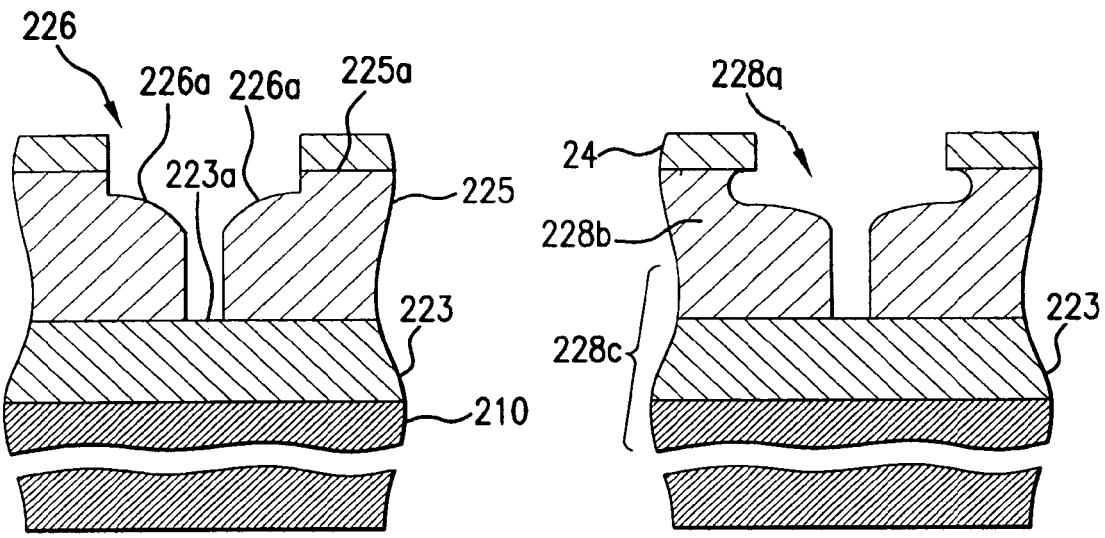
FIG. 16 is a detailed elevation view of the subsection shown in FIG. 15, after an isotropic selective etch to expose the etch-stop layer.
FIG. 17 is a detailed elevation view of the subsection shown in FIG. 16, after an additional isotropic selective etch to form the bulbous-shaped via and an ultra-violet radiation exposure to remove the section of the exposed etch-stop layer.

As shown in FIGS. 14 and 16, the selective anisotropic etch also results in rounding of shoulders 226a, while a portion of imprint layer 24 remains on surface 125a of planarization layer 225. This is followed by formation of a bulbous-shaped via 228, shown more clearly in FIG. 17 by a selective isotropic etch.

Referring to FIGS. 16 and 17, bulbous-shaped via 228 has two distinct regions, a curved bulb region 228b and a narrow waist region 228c. The bulbous-shaped region 228b is formed by the selective isotropic selective etch. To extend narrow waist region 228c to substrate 210, shown in FIG. 16, region 223a is removed. Region 223a may be removed in any known manner in the art. In one example, etch-stop layer 223 is formed from actinic radiation reactive material. When exposed to actinic radiation, e.g., ultra-violet radiation, etch-stop layer 223 becomes less dense and is subsequently developed-away using known techniques, e.g., etch-stop layer may have positive photo-resist properties. The planarization layer 225 may absorb the actinic radiation used to expose etch-stop layer 223. In addition, etch-stop layer 223 is resistant to the aforementioned etching steps. An exemplary material from which etch-stop layer 223 is formed is silated methacrylate. Alternatively, etch-stop layer 223 may be formed from other materials which may be removed employing conventional wet-etch techniques. This may be desirable were it possible to remove region 223a of etch-stop layer 223 while avoiding significant undercut of planarization layer 225. As a result of the aforementioned processes, multiple vias 228a and 229a may be formed concurrently on substrate 210 while reducing, if not preventing the same from extending beyond surface 212, shown more clearly in FIG. 18. In addition, subsequent processing may be employed, as discussed above to provide a conductive contact in bulbous-shaped via 228 or to provide a T-shaped gate, as discussed above.

Figure 18:
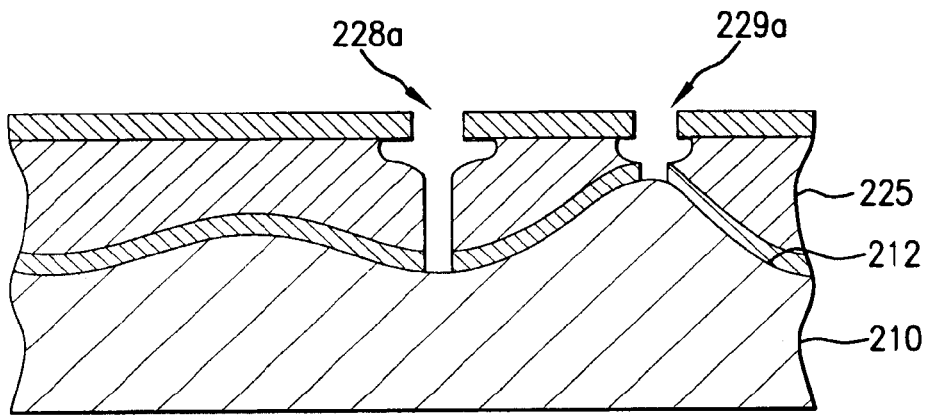
FIG. 18 is a simplified cross-section view showing the formation of multiple bulbous-shaped vias on a substrate.
Figure 19:
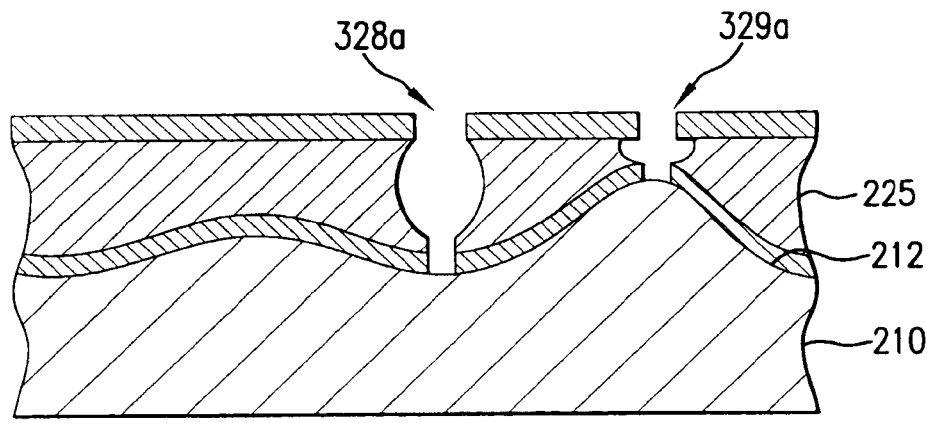
FIG. 19 is a simplified cross-section view showing the formation of multiple bulbous-shaped vias on a substrate in accordance with an alternate embodiment of the present invention.

Referring to both FIGS. 18 and 19, were it preferred to reduce the aspect ratio of vias 228a and 229a, an alternative process may include a step of exposing vias 228a and 229a to a solvent to form bulbed vias 328a and 329a. An exemplary process would expose vias 228a and 229a to the solvent following exposure of region 223a to actinic radiation, but before removing region 223a to expose a sub-portion of substrate 210. As a result, the combination of materials in planarization layer 225, etch-stop layer 223 and solvent would be selected accordingly. Specifically, region 223a after being subject to actinic radiation would be resistant to the aforementioned solvent whereas planarization layer 225 would be highly susceptible to etching by the same. An exemplary combination of materials would include planarization layer 225 being formed from polyhydroxylstyrene, etch-stop layer 223 being formed from silate methacrylate and a solvent of dilute aqueous alkyli. Bulbed vias 328a and 329a may be employed to provide a T-shaped gate, as discussed above.

The embodiments of the present invention described above are exemplary. Many changes and modifications may be made to the disclosure recited above, while remaining within the scope of the invention. For example, the discussion had been made with respect to forming bulbous-shaped vias. However, the benefit of the etch-stop layer may be demonstrated for forming vias of traditional shape on substrates having extreme topologies. In addition, the method discussed above for forming vias are discussed with respect to negative imprint lithography process. A positive imprint lithography process may also be employed. Vias may also be formed by use of the imprint layer and etch-stop layer combination, abrogating the use of planarization layer. The scope of the invention should, therefore, be determined not with reference to the above description, but instead should be determined with reference to the appended claims along with their full scope of equivalents.

What is claimed is:

1. A method for fabricating vias on a substrate having a surface, comprising:
   disposing, adjacent to said substrate, a polymerizable fluid composition;
   contacting said polymerizable fluid composition with a mold having a relief structure, with said polymerizable fluid composition conforming to a profile of said mold;
   subjecting said polymerizable fluid composition to conditions to polymerize said polymerizable fluid composition, forming a polymerized layer having a bi-level indentation including a nadir and shoulders spaced-apart from said nadir;

forming a relief pattern adjacent to said substrate having an opening extending toward said surface by selectively removing material adjacent to said substrate, with said material including a sub-section of said polymerized layer located proximate to said bi-level indentation; and depositing a conductive layer to cover said relief pattern, thereby forming a contact having a shape defined by said relief pattern.

2. The method as recited in claim 1 wherein forming further includes selectively etching said nadir.

3. The method as recited in claim 1 further including disposing a planarization layer on said surfaces to be positioned between said surface and said polymerizable fluid composition, with selectively removing further including etching said bi-level indentation to expose a sub-portion of said surface, with said material further including a portion of said planarization layer.

4. The method as recited in claim 1 further including disposing an etch-stop layer on said surface, and disposing a planarization layer adjacent to said etch-atop layer, with said planarization layer being disposed between said etch-stop layer and said polymerizable fluid composition, said etch-stop layer having positive resist properties, with forming further including etching said bi-level indentation to form said relief pattern in said planarization layer, with said relief pattern matching a contour of said bi-level indentation, selectively etching said relief pattern to expose a sub-portion of said etch-stop layer, subjecting said sub-portion to conditions to change properties associated with said etch-stop layer, and removing said sub-portion to expose a region of said surface in superimposition with said sub-portion, with said material further including said sub-portion.

5. The method as recited in claim 1 further including removing said polymerized layer.

6. The method as recited in claim 1 further including providing said mold with said relief structure, with said relief structure being selected from a set consisting essentially of a projection and a recession.

7. The method as recited in claim 1 wherein said polymerizable fluid composition includes a mono-functional acrylate component, a poly-functional molecule component, and an initiator component combined with said mono-functional acrylate component and said poly-functional molecule component to provide a viscosity no greater than 2 cps to preferentially wet said surface forming a contact angle therewith no greater than 75°, with said initiator component being responsive to ultra violet radiation to initiate a free radical reaction to cause said mono-functional acrylate component and said poly-functional molecule component to polymerize and cross-link.

8. The method as recited in claim 1 wherein said polymerizable fluid composition includes a combination of a plurality of mono-functional acrylate molecules, a plurality of poly-functional molecules; and a plurality of initiator molecules, with said combination having a viscosity in a range of 1 to 2 cps, and preferentially wets an organic polymer surface forming a contact angle of less than 75°, while not dissolving more than 500 nm of said organic polymer surface upon being removed one minute after wetting said organic polymer surface, minimizing wetting of an adjacent silylating containing surface, forming a contact angle therewith that is greater than 75°, with said plurality of initiator molecules being responsive to a pulse of ultra-violet radiation, containing less than 5 J cm-2, to cause said plurality of mono-functional acrylate molecules and said plurality of poly-functional molecules to polymerize and cross-link, defining a cross-linked polymer layer, said composition providing thermal stability to said cross-linked polymer layer when subjected to an atmosphere of 75° C. for thirty minutes so that a variation in an angle, measured between a bottom of an indention and a sidewall formed therein, is no more than 10%.

9. A method for fabricating vias on a substrate having a surface, comprising:

disposing an etch-stop layer on said surface;

disposing, adjacent to said etch-stop layer, a polymerizable fluid composition;

contacting said polymerizable fluid composition with a mold with said polymerizable fluid composition conforming to a profile of said mold;

subjecting said polymerizable fluid composition to conditions to polymerize said polymerizable fluid composition, forming a polymerized layer having a solidified indentation including a nadir and shoulders spaced-apart form said nadir, with said etch-stop layer being positioned between said surface and said polymerized layer; and defining an opening to said surface of said substrate by removing material disposed on said substrate, with said material including a sub-section of said polymerized layer positioned proximate to said solidified indentation and a sub-portion of said etch-stop layer in superimposition with said nadir.

10. The method as recited in claim 9 further including disposing a planarization layer adjacent to said etch-stop layer, with said planarization layer being disposed between said etch-stop layer and said polymerizable fluid composition, with removing further including etching said solidified indentation to expose and form a relief pattern in said planarization layer, with said relief pattern matching a contour of said solidified indentation, and etching said relief pattern to expose said sub-portion of said etch-stop layer, subjecting said sub-portion to conditions to change properties of said sub-portion and facilitate removing of said sub-portion to expose a region of said surface in superimposition with said sub-portion.

11. The method as recited in claim 10 further including depositing a conductive layer to cover said region and said relief pattern to form a contact having a shape defined by said relief pattern, and removing said polymerized layer and said planarization layer.

12. The method as recited in claim 11 wherein said polymerizable fluid composition includes a mono-functional acrylate component, a poly-functional molecule component; and an initiator component combined with said mono-functional acrylate component and said poly-functional molecule component to provide a viscosity no greater than 2 cps to preferentially wet said surface forming a contact angle therewith no greater than 75°, with said initiator component being responsive to actinic radiation to initiate a free radical reaction to cause said mono-functional acrylate component and said poly-functional molecule component to polymerize and cross-link.

13. A method for fabricating vias on a substrate having a surface, comprising:

disposing an etch-stop layer on said surface;

disposing a planarization layer onto said etch-stop layer;

disposing, on said planarization layer, a polymerizable fluid composition;

contacting said polymerizable fluid composition with a mold having a relief structure, with said polymerizable fluid composition conforming to a profile of said relief structure;

subjecting said polymerizable fluid composition to conditions to polymerize said polymerizable fluid composition, forming a polymerized layer having a solidified bi-level indentation including a nadir and shoulders spaced-apart from said nadir, with said etch-stop layer being positioned between said surface and said polymerized layer, said etch-stop, planarization and polymerized layers, defining a composite layer;

anisotropically etching said composite layer to form a relief pattern in said planarization layer, with said relief pattern matching a contour of said solidified bi-level indentation and having relief shoulders and a relief nadir, spaced-apart therefrom;

selectively etching said relief pattern to expose a sub-portion of said etch-stop layer in superimposition with said relief nadir; and removing said sub-portion to expose a region of said surface in superimposition therewith.

14. The method as recited in claim 13 further including removing said planarization layer employing a chemical wet-etch before removing said sub-portion.

15. The method as recited in claim 13 further including depositing a conductive layer to cover said region and said relief pattern to form a contact having a shape defined by said relief pattern.

16. The method as recited in claim 15 further including removing said polymerized layer and said planarization layer.

17. The method as recited in claim 16 further including forming source and drain portions in said substrate, with said region being positioned between said source and drain portions.

18. The method as recited in claim 17 wherein said polymerizable fluid composition includes a mono-functional acrylate component, a poly-functional molecule component; and an initiator component combined with said mono-functional acrylate component and said poly-functional molecule component to provide a viscosity no greater than 2 cps to preferentially wet said surface forming a contact angle therewith no greater than 75°, with said initiator component being responsive to actinic radiation to initiate a free radical reaction to cause said mono-functional acrylate component and said poly-functional molecule component to polymerize and to cross-link.

19. A method for fabricating vias on a substrate having a surface, comprising:

disposing, adjacent to said substrate, a planarization layer;

forming, on said planarization layer, a polymerized layer having a bi-level indentation; and etching said polymerized layer and said planarization layer to expose and form a relief pattern in said planarization layer, with said relief pattern having a curved bulb extending from a region of said planarization layer proximate to said polymerized layer and terminating in a narrow waist.

20. The method as recited in claim 19 wherein forming further includes depositing a polymerizable fluid composition and contacting said polymerizable fluid composition with a mold having a relief structure formed therein and subjecting said polymerizable fluid composition to conditions to polymerize said polymerizable fluid composition, forming said polymerized layer having said bi-level indentation.

21. The method as recited in claim 19 wherein said bi-level indentation further includes a nadir and shoulders spaced-apart from said nadir, with etching further including selectively etching said nadir to remove portions of said polymerized and planarization layers in superimposition with said nadir to expose an area of said substrate.

22. The method as recited in claim 19 further including disposing an etch-stop layer on said substrate, with said etch-stop layer being disposed between said substrate and said planarization layer.

23. The method as recited in claim 22 wherein said bi-level indentation further includes a nadir and shoulders spaced-apart from said nadir, with etching further including selectively etching said nadir to remove portions of said polymerized and planarization layers in superimposition with said nadir to expose an area of said etch-stop layer.

24. The method as recited in claim 19 further including disposing an etch-stop layer on said substrate, with said etch-stop layer being disposed between said substrate and said planarization layer, with said etch-stop layer having positive resist properties.

25. The method as recited in claim 19 further including depositing a conductive layer to cover said bi-level indentation to define a contact having a profile defined by said bi-level indentation.

26. The method as recited in claim 25 further including removing from said substrate, remaining portions of said planarization layer and said polymerized layer.

27. The method as recited in claim 19 wherein disposing further includes spin-coating an aromatic material onto said substrate.

28. The method as recited in claim 19 wherein forming further includes depositing, on said planarization layer, a material including a mono-functional acrylate component, a poly-functional molecule component, and an initiator component combined with said mono-functional acrylate component and said poly-functional molecule component.

* * * * *